US012813058B2

(12) United States Patent
Cao et al.

(10) Patent No.: US 12,813,058 B2
(45) Date of Patent: Nov. 24, 2026

(54) PHOTOVOLTAIC DEVICES AND METHODS OF MAKING

(71) Applicant: First Solar, Inc., Tempe, AZ (US)

(72) Inventors: Duyen Cao, Perrysburg, OH (US); Markus Gloeckler, Perrysburg, OH (US); Sachit Grover, Perrysburg, OH (US); James Hack, Perrysburg, OH (US); Chungho Lee, Perrysburg, OH (US); Dingyuan Lu, Perrysburg, OH (US); Aravamuthan Varadarajan, Perrysburg, OH (US); Gang Xiong, Perrysburg, OH (US); Zhibo Zhao, Perrysburg, OH (US)

(73) Assignee: First Solar, Inc., Phoenix, AZ (US)

( * ) Notice: Subject to any disclaimer, the term of this patent is extended or adjusted under 35 U.S.C. 154(b) by 0 days.

(21) Appl. No.: 18/039,820

(22) PCT Filed: Dec. 1, 2021

(86) PCT No.: PCT/US2021/061464
§ 371 (c)(1),
(2) Date: Jun. 1, 2023

(87) PCT Pub. No.: WO2022/119963
PCT Pub. Date: Jun. 9, 2022

(65) Prior Publication Data

US 2024/0015992 A1 Jan. 11, 2024

Related U.S. Application Data

(60) Provisional application No. 63/120,555, filed on Dec. 2, 2020.

(51) Int. Cl.
*H10K 30/10* (2023.01)
*H10K 71/12* (2023.01)

(52) U.S. Cl.
CPC ............ *H10K 30/10* (2023.02); *H10K 71/12* (2023.02)

(58) Field of Classification Search
CPC ........ H10K 30/10; H10K 71/12; Y02P 70/50; H01L 31/022425; H01L 31/073; H10F 10/162; H10F 77/211
See application file for complete search history.

(56) References Cited

U.S. PATENT DOCUMENTS 8,084,682 B2 12/2011 Chen
8,829,342 B2 9/2014 Compaan et al.
(Continued)

FOREIGN PATENT DOCUMENTS

CN 106711242 A 5/2017
CN 110556433 A * 12/2019 ....... H01L 31/02167
WO 2017081477 A1 5/2017

OTHER PUBLICATIONS

Dharmadasa ("Scientific complications and controversies noted in the field of CdS/CdTe thin film solar cells and the way forward for further development") Journal of Materials Science: Materials in Electronics (2019) 30:20330-20344 (Year: 2019).*
(Continued)

*Primary Examiner* — Angelo Trivisonno
(74) *Attorney, Agent, or Firm* — MacMillan, Sobanski & Todd, LLC

(57) ABSTRACT

Photovoltaic devices (100) with type II-VI semiconductor absorber materials (160) having p-type contact layers (180) are obtained by forming a II-VI absorber layer over a substrate stack (113), wherein the type II material includes cadmium (Cd) and the type VI material includes tellurium (Te); contacting an alkaline wash fluid, comprising a hydroxide, to a second surface of the absorber layer to produce a Cd-rich surface, depositing a p-type contact layer (180) over the absorber layer (160), whereby the p-type
(Continued)

contact layer is directly adjacent to the Cd-rich layer, and wherein the p-type contact layer comprises at least one of: PTAA, P3HT, poly-TPD, TFB, TTF-1, TF8-TAA, TIF8-TAA, SGT-407, PCDTBT, SpiroOMeTAD, anthracene-based HTM, polythiophene, semiconducting polymers, NiO, CuSCN, or Cui; and depositing a conductive layer (190) over the p-type contact layer.

20 Claims, 9 Drawing Sheets

(56) References Cited

U.S. PATENT DOCUMENTS

| | | | |
|---|---|---|---|
| 9,269,849 B2 | 2/2016 | Yu et al. | |
| 9,412,886 B2 | 8/2016 | Addepalli et al. | |
| 9,853,177 B2 | 12/2017 | Yu et al. | |
| 10,367,110 B2 | 7/2019 | Jin et al. | |
| 10,896,991 B2 | 1/2021 | Jin et al. | |
| 11,164,989 B2 | 11/2021 | Andreini et al. | |
| 11,342,471 B2 | 5/2022 | Grover et al. | |
| 11,695,085 B2 | 7/2023 | Jayamaha et al. | |
| 11,843,070 B2 | 12/2023 | Abken et al. | |
| 2011/0030782 A1* | 2/2011 | Oh | H10K 39/10 977/773 |
| 2011/0240123 A1 | 10/2011 | Lin et al. | |
| 2014/0273407 A1 | 9/2014 | Christensen et al. | |
| 2014/0326315 A1* | 11/2014 | Blaydes | H01L 31/03925 438/94 |
| 2015/0221812 A1 | 8/2015 | Reese et al. | |
| 2015/0228415 A1 | 8/2015 | Seok et al. | |
| 2018/0219166 A1 | 8/2018 | Ellingson et al. | |
| 2020/0111981 A1 | 4/2020 | Arora et al. | |
| 2021/0210606 A1* | 7/2021 | Colegrove | H01L 29/2203 |
| 2022/0102567 A1 | 3/2022 | Jin et al. | |

OTHER PUBLICATIONS

Reese ("Intrinsic surface passivation of CdTe"), Journal of Applied Physics 118, 155305 (2015) (Year: 2015).*
Translation of Qin (CN 110556433 A) (Year: 2024).*
Miandal, "The Structural and Optical Properties of Poly(Triarylamine) (PTAA) Thin Films Prepared at Different Spin Rate Using Spin Coating Method", Advanced Science Letters, vol. 23, No. 2, Feb. 2017, pp. 1337-1339(3) (Year: 2017).*
Reese et al., "Intrinsic surface passivation of CdTe", Journal of Applied Physics, 2015, vol. 118, No. 15, pp. 155305-1-155305-12.
International Search Report and Written Opinion, Application No. PCT/US2021/061464, dated Mar. 24, 2022.
Potamialis, "Copper Free Back Contacts for CdTe Solar Cells" dissertation, First Year Report, Loughborough University, Sep. 2015.
Bastola et al., "Solution-processed Nanocrystal Based Thin Films as Hole Transport Materials in Cadmium Telluride Photovoltaics", MRS Advances, 2018, pp. 1-6.
Bastola et al., "Structural, optical, and hole transport properties of earth-abundant chalcopyrite (CuFeS2) nanocrystals", MRS Communications, 2018, pp. 1-9.
Batzner et al., "A study of he back contacts on CdTe/CdS solar cells", Thin Solid Films 361-362, 2000, pp. 463-467.
Xiao et al., "CdTe thin film solar cell with NiO as a back contact buffer layer", Solar Energy Materials and Solar Cells, 2017, vol. 169, pp. 61-67.
Di et al., "Nickel oxide as back surface field buffer layer in CdTe thin film solar cell", Acta Physica Sinica, 2017, vol. 66, No. 11, 117301.
Hack et al., "Hole Transport Material for Passivated Back Contacts on CdTe Solar Cells", IEEE 48th Photovaltaic Specialist Conference (PVSC), 2021, pp. 1880-1882, doi:10.1109/PVSC43889.2021.9519026.
Hall et al., "Back contacts materials used in thin film CdTe solar cells—A review", Energy Science & Engineering, 2021, vol. 9, pp. 606-632.
Ikhmayies, "The CdTe Absorber Layer in CdS/CdTe Think Film Solar Cells", Research Gate, 2015, Retrieved from Internet on May 21, 2024: Retrieved from URL: http://www.researchgate.net/profile/Shadia_Ikhmayies/publication/272480831_The_CdTe_Absorber_Layer_In_CdSCdTe_Thin_Film_Solar_Cells/links/54e501fb0cf276cec172e734.
Kim et al., "Methoxy-functionalized Triarylamine-based Hole Transporting Polymers for Highly Efficient and Stable Perovskite Solar Cells", Department of Chemical and Biomolecular Engineering, pp. 1-23.
Li et al., "CuSCN as the Back Contact for Ecient ZMO/CdTe Solar Cells", Materials, 2020, vol. 13, Issue 1991, pp. 1-12.
McCandless et al., "Enhanced p-type Doping in Polycrystalline CdTe Films: Deposition and Activation", IEEE Journal of Photovoltaics, 2019, vol. 9, Issue 3, pp. 1-6.
Montgomery et al., "Solution-processed copper (I) thiocyanate (CuSCN) for highly efficient CdSe/CdTe thin-film solar cells" Prog. Photovolt. Res. Appl., 2019, pp. 1-8.
Rani et al., "Effect of Annealing Temperature on Electrical Properties of Hybrid ZnO/PTAA based Heterojunction Diode", ASM Science Journal, 2020, vol. 13, pp. 1-7.
Shalvey et al., "A comparison of organic back contact materials for CdTe solar cells", IEEE 7th World Conference on Photovoltaic Energy Conversion, 2018, DOI: 10.1109/PVSC2018.8547725.
Shalvey et al., "A comparison of organic back contact materials for CdTe solar cells", Conference Paper, 2018, DOI: 10.1109/PVSC2018.8547725, pp. 1-7.
Shen et al., "Stable CdTe solar cell with V2O5 as a back contact buffer layer", Solar Energy Materials and Solar Cells, 2016, vol. 144, Abstract Only.
Liyanage et al., Modeling the Performance of CdTe Solar Cells with a CH3NH3Pb(I1-xBrx)3 -like Back Buffer Layer, 7th World Conference on Photovoltaic Energy Conversion, 2018, Slides 1-13.
Song et al., "Pathways toward high-performance perovskite solar cells: review of recent advances in organo-metal halide perovskites for photovoltaic applications", Journal of Photonics for Energy, 2016, vol. 6, Issue 2, pp. 1-24.
Viswanathan, "Study of Cu Free Back Contacts to Thin Film CdTe Solar Cells", Dissertation, Dept. of Electrical Engineering, University of South Florida, 2004.
Tena-Zaera et al., "ZnO/CdTe/CuSCN, a promising heterostructure to act as inorganic eta-solar cell", Thin Sold Films 483, 2005, pp. 372-377.
Masood et al., "CdTe Thin Film Solar Cells Fabricated With CuO as a Buffer Layer in the Back Contact", IEEE Journal of Photovoltaics, 2017, pp. 1-6.
Siddique et al., A Study on the Performance of Cadmium Telluride (CdTe) Solar Cells Simulating with Different Layers in Front Contact, 2018 International Conference on Computer, Communication, Chemical Material and Electronic Engineering (IC4ME2), pp. 1-4.
Jarkov et al., "Conductive polymer PEDOT:PSS back contact for CdTe solar cell", Thin Solid Films 519, 2011, pp. 7449-7452.
Lee et al., "Improvement of Quantum Efficiency of P3HT:PCBM-Based Organic Photovoltaic Cells Using DMDCNQI as an N-Type Dopant and Buffer Layer", Journal of Nanoscience and Nanotechnology, 2013, vol. 13, pp. 2012-2015.
Romeo et al., "Development of Thin-film Cu(In, Ga)Se2 and CdTe Solar Cells", Progress in Photovoltaics: Research and Applications, 2004, vol. 12, pp. 93-111.
Hu et al., "Band diagrams and performance of CdTe solar cells with a Sb2Te3 back contact buffer layer", AIP Advances 1, 2011, pp. 042152-1-042152-12.
Ferekides et al., "CdTe thin film solar cells: device and technology issues", Solar Energy 77, 2004, pp. 823-830.
Har-Lavan et al., "40 Years of Inversion Layer Solar Cells: From MOS to Conducting Polymer/Inorganic Hybrids", IEEE Journal of Photovoltaics, 2013, vol. 3, No. 4, pp. 1443-1459.

(56) References Cited

OTHER PUBLICATIONS

Gavrilov et al., "Ways to Increase the Efficiency of Solar Cells with Extremely Thin Absorption Layers", ISSN 1995-0780, Nanotechnoliges in Russia, 2009, vol. 4, Nos. 3-4, pp. 237-243.
Matin et al., "Enhancing the efficiency of CdTe thin film solar cells by inserting novel back contact buffer layers", 2009 1st International Conference on the Developments in Renewable Energy Technology (ICDRET), Abstract Only, Retrieved from Internet on May 22, 2024; Retrieved from URL:https://ieeexplore.ieee.org/document/5454211.
Japanese Notification of Reason(s) for Rejection, dated Jan. 24, 2025, Application No. 2023-533646.
European Communication pursuant to Article 94(3) EPC, Application No. 21844430.5, dated Oct. 2, 2025.
Intellectual Property of India, Examination Report, Application No. 202317042753, dated Nov. 4, 2025.
Intellectual Property Office of Vietnam, Examination Report, Application No. 1-2023-04309, mailed Oct. 8, 2025.

* cited by examiner

PHOTOVOLTAIC DEVICES AND METHODS OF MAKING

CROSS-REFERENCE TO RELATED APPLICATIONS

This is a national phase application of international application PCT/US2021/061464, filed on Dec. 1, 2021, and claims the benefit of U.S. Provisional Application No. 63/120,555, filed on Dec. 2, 2020, each of which is incorporated by reference in the entirety.

BACKGROUND

The present specification generally relates to layers for photovoltaic devices and, more specifically, to the use of particular combinations of materials and layer formation parameters to improve the efficiency of photovoltaic devices.

A photovoltaic device generates electrical power by converting light into electricity using semiconductor materials that exhibit the photovoltaic effect. A p-type contact with low contact resistivity and low recombinational loss has been an ongoing challenge in thin-film cadmium telluride based solar cell development. A lack of high work function materials with good band alignment makes it difficult to form an ohmic contact to p-type CdTe and other type II-VI semiconductor alloys. Accordingly, material layers for improving efficiency of photovoltaic devices are desired.

Accordingly, a need exists for alternative layer structures and compositions for use in photovoltaic devices.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, wherein like reference numerals designate identical or corresponding parts throughout the views.

DETAILED DESCRIPTION

Photovoltaic devices can be formed from a stack of functional layers formed over a substrate. One or more of the functional layers can include a thin film of material, i.e., the photovoltaic device can be a thin film photovoltaic device. Thin film photovoltaic devices can include an absorber layer for converting light into charge carriers, and conductive layers for collecting the charge carriers. As charge carriers are generated, an electric potential is produced by the separation of charges. The positive and negative charge carriers, holes and electrons respectively, move in opposite directions, towards p-type and n-type regions on opposite sides of the absorber.

In thin-film cadmium telluride based solar cell development, producing a p-type contact with low contact resistivity and low recombinational loss has been an ongoing challenge. A lack of high work function materials with a good band alignment makes it difficult to form an ohmic contact to p-type CdTe and its alloys. Interface engineering with the described materials and methods provide an interfacial layer, back contact, or p-type contact layer with a high hole conductivity and a low electron affinity. Therefore, when the p-type majority carriers (holes) reach the contact interface, the p-type contact layer efficiently transports holes from the absorber and minimizes interfacial recombination.

The p-type contact layer provides a good back contact to solar cells having an absorber comprising an alloy of cadmium and tellurium, including, binary, ternary, and quaternary alloys. The p-type contact layer has good band alignment to CdTe, with a low or negligible hole transport barrier and a high electron barrier for electron reflection. The p-type contact layer has minimal interfacial defects, good passivation, and a high conductivity. The p-type contact layer has a high doping for a deep Fermi level and a high hole mobility. In some instances, the p-type contact layer can be formed towards the back side of the module with respect to the absorber layer. In some instances, the p-type contact layer can be formulated to be substantially transparent and may be formed towards a front, or light-facing, side of the module with respect to the absorber layer. The embodiments provided herein relate to p-type contact layers and photovoltaic devices including the same. The disclosed p-type contact layers can improve efficiency of current collecting portions of photovoltaic devices.

Figure 1:
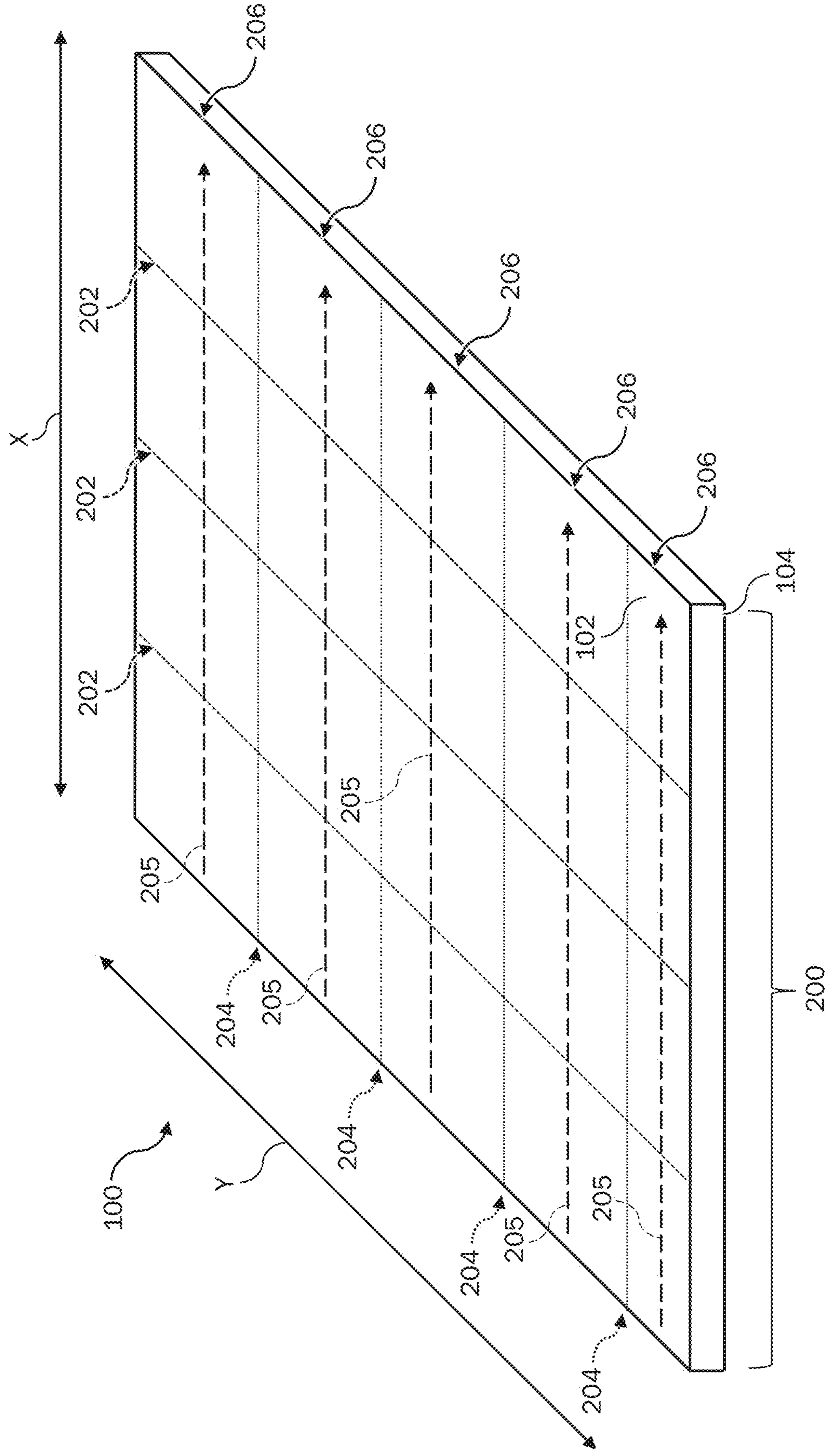
FIG. 1 schematically depicts a photovoltaic device according to one or more embodiments shown and described herein.

Referring now to FIG. 1, an embodiment of a photovoltaic device 100 is schematically depicted. The photovoltaic device 100 can be configured to receive light and transform light into electrical energy, e.g., photons can be absorbed from the light and transformed into electrical current via the photovoltaic effect. Thus, for sake of discussion and clarity, the photovoltaic device 100 can define a front side 102 configured to face a primary light source such as, for example, the sun. Additionally, the photovoltaic device 100 can also define a back side 104 offset from the front side 102 such as, for example, by a plurality of functional layers of material. It is noted that the term "light" can refer to various wavelengths of the electromagnetic spectrum such as, but not limited to, wavelengths in the ultraviolet (UV), infrared (IR), and visible portions of the electromagnetic spectrum. "Sunlight," as used herein, refers to light emitted by the sun.

The photovoltaic device 100 can include a plurality of layers disposed between the front side 102 and the back side 104. As used herein, the term "layer" refers to a thickness of material provided upon a surface. Each layer can cover all or any portion of an adjacent surface. In some embodiments, the layers of the photovoltaic device 100 can be divided into an array of photovoltaic cells 200. For example, the photovoltaic device 100 can be scribed according to a plurality of serial scribes 202 and a plurality of parallel scribes 204. The serial scribes 202 can extend along a length Y of the photovoltaic device 100 and demarcate the photovoltaic cells 200 along the length Y of the photovoltaic device 100. Neighboring cells of the photovoltaic cells 200 can be serially connected along a width X of the photovoltaic device 100. In other words, a monolithic interconnect of the neighboring cells 200 can be formed, i.e., adjacent to the serial scribe 202. The parallel scribes 204 can extend along the width X of the photovoltaic device 100 and demarcate the photovoltaic cells 200 along the width X of the photovoltaic device 100. Under operations, current 205 can predominantly flow along the width X through the photovoltaic cells 200 serially connected by the serial scribes 202. Under operations, parallel scribes 204 can limit the ability of current 205 to flow along the length Y. Parallel scribes 204 are optional and can be configured to separate the photovoltaic cells 200 that are connected serially into groups 206 arranged along length Y.

Referring still to FIG. 1, the parallel scribes 204 can electrically isolate the groups 206 of photovoltaic cells 200 that are connected serially. In some embodiments, the groups 206 of the photovoltaic cells 200 can be connected in parallel such as, for example, via electrical bussing. Optionally, the number of parallel scribes 204 can be configured to limit a maximum current generated by each group 206 of the photovoltaic cells 200. In some embodiments, the maximum current generated by each group 206 can be less than or equal to about 200 milliamps (mA) such as, for example, less than or equal to about 100 mA in one embodiment, less than or equal to about 75 mA in another embodiment, or less than or equal to about 50 mA in a further embodiment.

Figure 2:
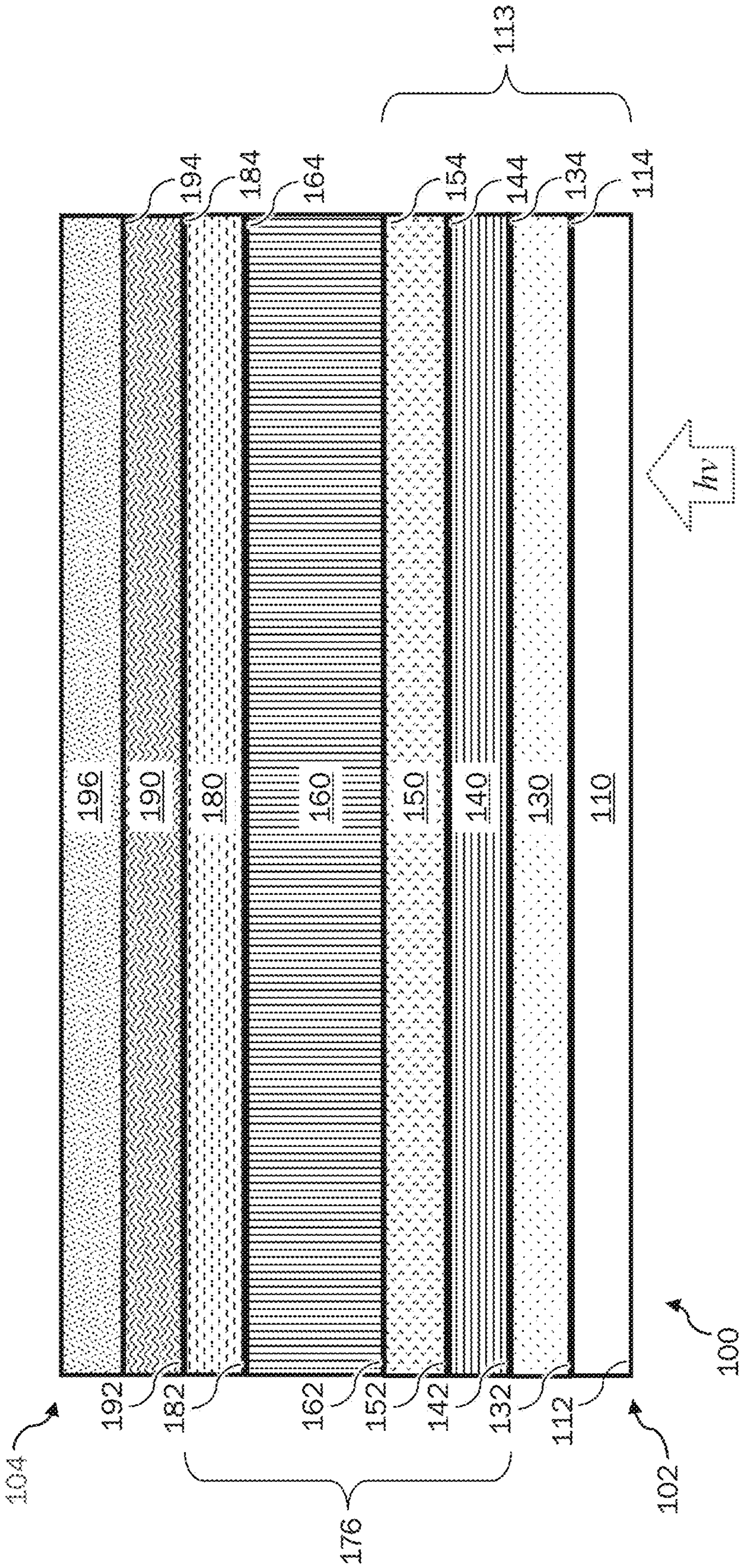
FIG. 2 schematically depicts a cross-sectional view of a segment of the photovoltaic device of FIG. 1 according to one or more embodiments shown and described herein.

Referring now to FIG. 2, the layers of the photovoltaic device 100 can include a thin film stack provided over a substrate 110. The substrate 110 can be configured to facilitate the transmission of light into the photovoltaic device 100. The substrate 110 can be disposed at the front side 102 of the photovoltaic device 100. The substrate 110 can have a first surface 112 substantially facing the front side 102 of the photovoltaic device 100 and a second surface 114 substantially facing the back side 104 of the photovoltaic device 100. One or more layers can be disposed between the first surface 112 and the second surface 114 of the substrate 110.

The substrate 110 can include a transparent layer. The transparent layer can be formed from a substantially transparent material such as, for example, glass. Suitable glass can include soda-lime glass, or any glass with reduced iron content. The transparent layer can have any suitable transmittance range, including about 250 nm to about 1,300 nm in some embodiments. The transparent layer may also have any suitable transmittance percentage, including, for example, more than about 50% in one embodiment, more than about 60% in another embodiment, more than about 70% in yet another embodiment, more than about 80% in a further embodiment, or more than about 85% in still a further embodiment. In one embodiment, the transparent layer can be formed from a glass with about 90% transmittance, or more. Optionally, the substrate 110 can include a coating at the first surface 112. The coating can be configured to interact with light or to improve durability of the substrate 110 such as, but not limited to, an antireflective coating, an antisoiling coating, or a combination thereof.

Referring again to FIG. 2, the photovoltaic device 100 can include a barrier layer 130 configured to mitigate diffusion of contaminants (e.g., sodium) from the substrate 110, which could result in degradation or delamination of other layers of the photovoltaic stack. The barrier layer 130 can have a first surface 132 substantially facing the front side 102 of the photovoltaic device 100 and a second surface 134 substantially facing the back side 104 of the photovoltaic device 100. In some embodiments, the barrier layer 130 can be provided adjacent to the substrate 110. For example, the first surface 132 of the barrier layer 130 can be provided upon the second surface 114 of the substrate 100. The phrase "adjacent to," as used herein, means that two layers are disposed contiguously and without any intervening materials between at least a portion of the layers.

Generally, the barrier layer 130 can be substantially transparent, thermally stable, with a reduced number of pin holes and having high sodium-blocking capability, and good adhesive properties. Alternatively or additionally, the barrier layer 130 can be configured to apply color suppression to light. The barrier layer 130 can include one or more layers of suitable material, including, but not limited to, tin oxide, silicon dioxide, aluminum-doped silicon oxide, silicon oxide, silicon nitride, or aluminum oxide. The barrier layer 130 can have any suitable thickness bounded by the first surface 132 and the second surface 134, including, for example, more than about 100 Å in one embodiment, more than about 150 Å in another embodiment, or less than about 200 Å in a further embodiment.

Referring still to FIG. 2, the photovoltaic device 100 can include a n-type contact layer 140 configured to provide electrical contact to transport charge carriers generated by the photovoltaic device 100. The n-type contact layer can be a transparent conductive oxide (TCO) layer 140. The TCO layer 140 can have a first surface 142 substantially facing the front side 102 of the photovoltaic device 100 and a second surface 144 substantially facing the back side 104 of the photovoltaic device 100. In some embodiments, the TCO layer 140 can be provided adjacent to the barrier layer 130. For example, the first surface 142 of the TCO layer 140 can be provided upon the second surface 134 of the barrier layer 130. Generally, the TCO layer 140 can be formed from one or more layers of n-type semiconductor material that is substantially transparent and has a wide band gap. Specifically, the wide band gap can have a larger energy value compared to the energy of the photons of the light, which can mitigate undesired absorption of light. The TCO layer 140 can include one or more layers of suitable material, including, but not limited to, tin dioxide, doped tin dioxide (e.g., F—$SnO_2$), indium tin oxide, or cadmium stannate ($Cd_2SnO_4$). In embodiments where the TCO layer 140 comprises cadmium stannate, the cadmium stannate can be provided in a crystalline form. For example, the cadmium stannate can be deposited as a film and then subjected to an annealing process, which transforms the thin film into a crystallized film.

The photovoltaic device 100 can include a buffer layer 150 configured to provide an insulating layer between the TCO layer 140 and a semiconductor layer. The buffer layer 150 can have a first surface 152 substantially facing the front side 102 of the photovoltaic device 100 and a second surface 154 substantially facing the back side 104 of the photovoltaic device 100. In some embodiments, the buffer layer 150 can be provided adjacent to the TCO layer 140. For example, the first surface 152 of the buffer layer 150 can be provided upon the second surface 144 of the TCO layer 140. The buffer layer 150 can include material having higher resistivity than the TCO later 140, including, but not limited to, intrinsic tin dioxide, zinc magnesium oxide (e.g., $Zn_{1-x}Mg_xO$), silicon dioxide ($SnO_2$), aluminum oxide ($Al_2O_3$), aluminum nitride (AlN), zinc tin oxide, zinc oxide, tin silicon oxide, or any combination thereof. In some embodiments, the material of the buffer layer 150 can be configured to substantially match the band gap of an adjacent semiconductor layer (e.g., an absorber). The buffer layer 150 may have any suitable thickness between the first surface 152 and the second surface 154, including, for example, more than about 100 Å in one embodiment, between about 100 Å and about 800 Å in another embodiment, or between about 150 Å and about 600 Å in a further embodiment.

Referring still to FIG. 2, the photovoltaic device 100 can include an absorber layer 160 configured to cooperate with another layer and form a p-n junction within the photovoltaic device 100. Accordingly, absorbed photons of the light can free electron-hole pairs and generate carrier flow, which can yield electrical energy.

A partly formed device, including a substrate 110, an n-type layer including a TCO layer 140 and/or a buffer layer 150, and layers therebetween, may be referred to as a substrate stack 113. The absorber layer 160 may be formed over the substrate stack 113. The absorber layer 160 can have a first surface 162 substantially facing the front side 102 of the photovoltaic device 100 and a second surface 164 substantially facing the back side 104 of the photovoltaic device 100. A thickness of the absorber layer 160 can be defined between the first surface 162 and the second surface 164. The thickness of the absorber layer 160 can be between about 0.5 μm to about 10 μm such as, for example, between about 1 μm to about 7 μm in one embodiment, or between about 1.5 μm to about 4 μm in another embodiment.

According to the embodiments described herein, the absorber layer 160 can be formed from a p-type semiconductor material having an excess of positive charge carriers, i.e., holes or acceptors. The absorber layer 160 can include any suitable p-type semiconductor material such as group II-VI semiconductors such as, for example, cadmium and tellurium. Further examples include, but are not limited to, semiconductor materials comprising cadmium, zinc, tellurium, selenium, or any combination thereof. In some embodiments, the absorber layer 160 can include ternaries of cadmium, selenium and tellurium (e.g., $CdSe_xTe_{1-x}$), or a compound comprising cadmium, selenium, tellurium, and one or more additional element (e.g., CdZnSeTe). The absorber layer 160 may further comprise one or more dopants. The photovoltaic devices 100 provided herein may include a plurality of absorber materials.

In embodiments where the absorber layer 160 comprises tellurium and cadmium, the average atomic percent of the tellurium in the absorber layer 160 can be greater than or equal to about 25 atomic percent and less than or equal to about 50 atomic percent such as, for example, greater than about 30 atomic percent and less than about 50 atomic percent in one embodiment, greater than about 40 atomic percent and less than about 50 atomic percent in a further embodiment, or greater than about 47 atomic percent and less than about 50 atomic percent in yet another embodiment. Alternatively or additionally, average atomic percent of the tellurium in the absorber layer 160 can be greater than about 45 atomic percent such as, for example, greater than about 49% in one embodiment. It is noted that the average atomic percent described herein is representative of the entirety of the absorber layer 160, the atomic percentage of material at a particular location within the absorber layer 160 can be graded through the thickness compared to the overall composition of the absorber layer 160. For example, the absorber layer 160 can have a graded composition.

In embodiments where the absorber layer 160 comprises selenium and tellurium, the average atomic percent of the selenium in the absorber layer 160 can be greater than 0 atomic percent and less or equal to than about 25 atomic percent such as, for example, greater than about 1 atomic percent and less than about 20 atomic percent in one embodiment, greater than about 1 atomic percent and less than about 15 atomic percent in another embodiment, or greater than about 1 atomic percent and less than about 8 atomic percent in a further embodiment. It is noted that the concentration of tellurium, selenium, or both can be graded through the thickness of the absorber layer 160. For example, when the absorber layer 160 comprises a compound including selenium at a mole fraction of x and tellurium at a mole fraction of 1−x ($Se_xTe_{1-x}$), x can vary in the absorber layer 160 with distance from the first surface 162 of the absorber layer 160.

Referring still to FIG. 2, the absorber layer 160 can be doped with a dopant configured to manipulate the charge carrier concentration. In some embodiments, the absorber layer 160 can be doped with a Group V dopant such as, for example, arsenic, phosphorous, antimony, or a combination thereof. Alternatively or additionally, the absorber layer 160 can be doped with a Group IB dopant such as, for example, copper, silver, gold, or a combination thereof. The total density of the dopant within the absorber layer 160 can be controlled. Moreover, the amount of the dopant can vary with distance from the first surface 162 of the absorber layer 160.

According to the embodiments provided herein, the p-n junction can be formed by providing the absorber layer 160 sufficiently close to a portion of the photovoltaic device 100 having an excess of negative charge carriers, i.e., electrons or donors. For example, a p-type absorber layer may be provided on an n-type TCO layer 140, optionally with an intervening buffer layer 150. In some embodiments, the absorber layer 160 can be provided adjacent to n-type semiconductor material. Alternatively, one or more intervening layers can be provided between the absorber layer 160 and n-type semiconductor material. In some embodiments, the absorber layer 160 can be provided adjacent to the buffer layer 150. For example, the first surface 162 of the absorber layer 160 can be provided upon the second surface 154 of the buffer layer 150. In some embodiments, the absorber layer 160 can be provided adjacent to the TCO layer 140. For example, the first surface 162 of the absorber layer 160 can be provided upon the second surface 144 of the TCO layer 140.

The photovoltaic device 100 can include a p-type contact layer 180 configured to provide electrical contact to the absorber layer 160. The p-type contact layer 180 can have a first surface 182 substantially facing the energy side 102 of the photovoltaic device 100 and a second surface 184 substantially facing the opposing side 104 of the photovoltaic device 100. The p-type contact layer 180 can be a back contact layer having a first surface 182 substantially facing the absorber layer 160. A thickness of the p-type contact layer 180 can be defined between the first surface 182 and the second surface 184. A thickness of the p-type contact layer 180 can be less than about 500 nm such as, for example, between about 0.5 nm and about 100 nm in one embodiment, or between about 5 nm and about 50 nm in another embodiment. In some embodiments, the thickness of the p-type contact layer 180 can be between about 5 nm to about 200 nm such as, for example, between about 10 nm to about 50 nm in one embodiment.

In some embodiments, the p-type contact layer 180 is a polymer, a small molecule, or an inorganic compound. In some embodiments, the p-type contact layer comprises a polymer material selected from Poly[bis(4-phenyl)(2,4,6-trimethylphenyl)amine](PTAA), Poly(9,9-dioctylfluorene-alt-N-(4-sec-butylphenyl)-diphenylamine) (TFB), Poly[(9,9-dioctylfluorenyl-2,7-diyl)-co-(4,4'-(N-(2,4-dimethylphenyl))diphenylamine)](PF8-TAA), Poly[[(2,4-dimethylphenyl)imino]-1,4-phenylene(6,12-dihydro6,6,12,12-tetraoctylindeno[1,2-b]fluorene-2,8-diyl)-1,4-phenylene] (PIF8-TAA), Poly(3-hexylthiophene-2,5-diyl) (P3HT), Poly(N,N'-bis-4-butylphenyl-N,N'-bisphenyl)benzidine (PolyTPD), Polythiophene, or Poly(3,4-ethylenedioxythiophene)-poly(styrenesulfonate) (PEDOT:PSS). In some embodiments, the p-type contact layer is PTAA. In some embodiments, the p-type contact layer comprises a small molecule selected from N2,N2,N2',N2',N7,N7,N7',N7'-octakis(4-methoxyphenyl)-9,9'-spirobi[9H-fluorene]-2,2', 7,7'-tetramine (Spiro-OMeTAD), N2,N2,N2',N2',N7,N7,N7',N7'-octakis(4-methoxyphenyl)-10-phenyl-10H-spiro [acridine-9,9'-fluorene]-2,2', 7,7'-tetraamine (SAF-OMe), N,N'-dialkyl perylenediimide (PDI), 4,4'-Bis(N-carbazolyl)-1,1'-biphenyl (CBP), Tris(4-carbazoyl-9-ylphenyl)amin (TCTA), 1,3,5-Tris(carbazol-9-yl)benzene (TCP), tris{N, N-bis (4-methoxyphenyl)-N-phenyl}amine quinolizino arcidine (OMeTPA-FA), SGT-407, Fused-F, or tetrathiafulvalene (TTF-1). In some embodiments the p-type contact layer comprises a material selected from: alpha-NPD, 6,13-bis (triisopropylsilylethynyl) pentacene (TIPS-pentacene), Poly [2,6-(4,4-bis-(2-ethylhexyl)-4H-cyclopenta [2,1-b;3,4-b']dithiophene)-alt-4,7(2,1,3-benzothiadiazole)] (PCPDTBT), Poly[N-9'-heptadecanyl-2,7-carbazole-alt-5,5-(4', 7'-di-2-thienyl-2', 1', 3'-benzothiadiazole)] (PCDTBT), graphene oxide, and quinolizino acridine. In some embodiments, the p-type contact layer comprises an inorganic compound selected from nickel oxide (NiOx), cuprous thiocyanate (CuSCN), copper iodide (CuI), or copper oxide ($Cu_2O$). In some embodiments, the p-type contact layer is nickel oxide (NiOx).

A thin film junction 176 can be defined as the thin film stack primarily contributing to the photovoltaic effect. For example, in some embodiments, the thin film junction 176 can include the transparent conductive oxide layer 140, the buffer layer 150, the absorber layer 160, and the p-type contact layer 180.

The photovoltaic device 100 can include a conducting or conductive layer 190 configured to provide electrical contact with the absorber layer 160. The conductive layer 190 can have a first surface 192 substantially facing the energy side 102 of the photovoltaic device 100 and a second surface 194 substantially facing the opposing side 104 of the photovoltaic device 100. In some embodiments, the conductive layer 190 can be provided adjacent to the p-type contact layer 180. For example, the first surface 192 of the conductive layer 190 can be provided upon the second surface 184 of the p-type contact layer 180. The conductive layer 190 can include any suitable conducting material such as, for example, one or more layers of nitrogen-containing metal, silver, nickel, copper, aluminum, titanium, palladium, chrome, molybdenum, gold, or the like. Suitable examples of a nitrogen-containing metal layer can include aluminum nitride, nickel nitride, titanium nitride, tungsten nitride, selenium nitride, tantalum nitride, or vanadium nitride.

The photovoltaic device 100 can include a back support 196 configured to cooperate with the substrate 110 to form a housing for the photovoltaic device 100. The back support 196 can be disposed at the opposing side 102 of the photovoltaic device 100. For example, the back support 196 can be formed adjacent to conductive layer 190. The back support 196 can include any suitable material, including, for example: borosilicate glass, float glass, soda lime glass, carbon fiber, or polycarbonate.

Figure 3:
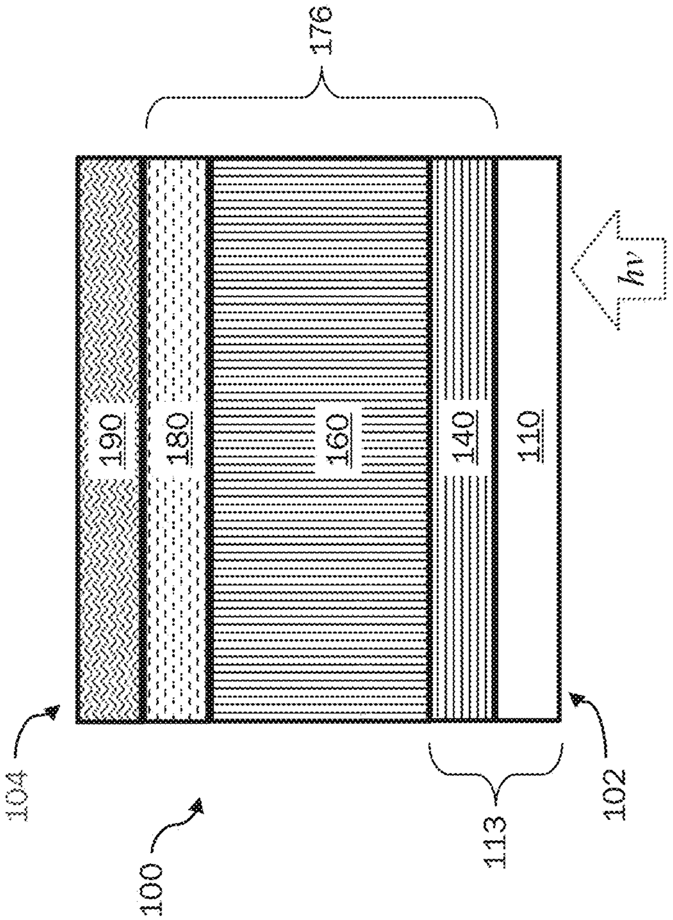
FIG. 3 schematically depicts a cross-sectional view of a segment of a photovoltaic device according to one or more embodiments shown and described herein.

FIG. 3 shows a device like in FIG. 2, having a substrate 110 on a light facing front side 102, a n-type contact layer 140 over the substrate 110, an absorber layer 160 over the n-type contact layer 140, and a p-type contact 180 between the absorber layer 160 and the conductive layer 190.

Figure 4:
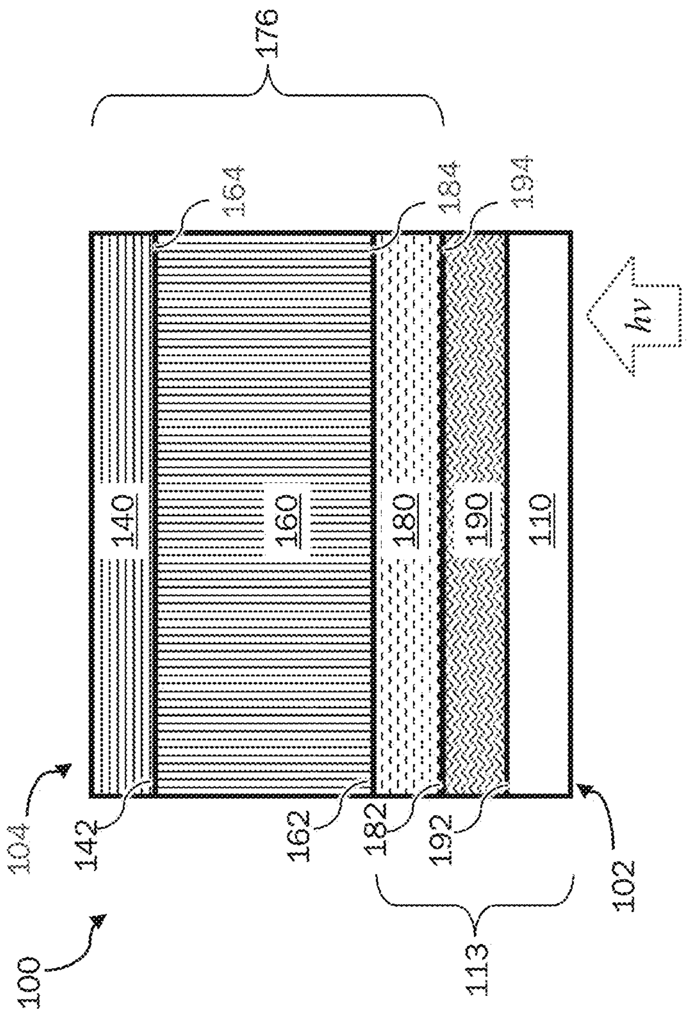
FIG. 4 schematically depicts a cross-sectional view of a segment of a photovoltaic device according to one or more embodiments shown and described herein.

FIG. 4 shows a device similar to the device shown in FIG. 3, but inverted with respect to the polarity of the contact layers on either side of the absorber layer 160, having the p-type contact layer 180 towards the light-facing front side 102, relative to the n-type contact layer 140. In the orientation shown in FIG. 4, the absorber layer 160 can be provided over a substrate stack 113 comprising the p-type contact layer 180.

The p-type contact layer 180 can have a first surface 182 substantially facing the front side 102 of the photovoltaic device 100 and a second surface 184 substantially facing the back side 104 of the photovoltaic device 100. The p-type contact layer 180 can be provided between the conductive layer 190 and the absorber layer 160. In some embodiments, the p-type contact layer 180 can be provided adjacent to one or both of the conductive layer 190 and the absorber layer 160. For example, as illustrated in FIG. 4, the first surface 182 of the p-type contact layer 180 can be provided upon the second surface 194 of the conductive layer 190 and the second surface 184 of the p-type contact layer 180 can be adjacent to the first surface 162 of the absorber layer 160. A thickness of the p-type contact layer 180 can be defined between the first surface 182 and the second surface 184.

Referring collectively to FIGS. 3 and 4, the photovoltaic device 100 can include a p-type contact layer 180 adjacent to the absorber layer 160. FIGS. 3-4 show the thin film junction 176 comprising the n-type contact layer 140, the absorber layer 160, and the p-type contact layer 180.

Referring collectively to FIGS. 1-4, a substrate stack 113 of the photovoltaic device 100 is positioned toward the light-facing front side 102 and opposite the back side 104. The absorber layer is provided over substrate stack 113. The layers comprising the substrate stack 113 are substantially transparent. The photovoltaic device 100 can include a plurality of layers and, where layers are not specified as adjacent, the photovoltaic device may include intervening layers not depicted. Layers can include one or more functional layers of material and a single layer may have a compositional gradient therein. A deployment-ready device may further include electrical connections, encapsulation, and other features.

Photovoltaic devices may contain several material layers deposited sequentially over a substrate. Steps for manufacturing a photovoltaic device may include sequentially disposing functional layers or layer precursors in a “stack” of layers through one or more deposition processes, including, but not limited to, spin coating, spray coating, slot coating, blade coating, dip coating, sputtering, evaporation, molecular beam deposition, pyrolysis, closed space sublimation (CSS), pulse laser deposition (PLD), chemical vapor deposition (CVD), electrochemical deposition (ECD), atomic layer deposition (ALD), or vapor transport deposition (VTD). The as-deposited layer or layer stack may be processed to modify characteristics using one or more methods, for example, by annealing, passivating, heating, vapor contact, or chemical treatment. Manufacturing of photovoltaic devices can further include the selective removal of portions of certain layers of the stack of layers, such as by scribing, to divide the photovoltaic device into a plurality of photovoltaic cells.

Suitable materials for the p-type contact layer 180 can include a polymer, a small molecule, or an inorganic compound. Without being bound to theory, applicant has discovered that these materials can exhibit improved electrical properties when formed in contact with a type II-VI semiconductor alloy. It is further believed that the combination of selected materials can provide a robust structure that is resistant to degradation.

One group of materials suitable for use in the p-type contact layer includes such as, for example, a polymer, wherein the polymer is one of PTAA, P3HT, or PEDOT:PSS.

Another group of materials suitable for use in the p-type contact layer includes small molecule compositions, such as, for example, Spiro-OMeTAD, SAF-OMe, SGT-407, Fused-F, OMeTPA-FA, or TTF-1. The small molecule compositions may be doped. Examples of p-dopants include but not limited to: F4-TCNQ, transition metal oxides such as molybdenum tri-oxide ($MoO_3$), vanadium pent-oxide ($V_2O_5$) or tungsten tri-oxide ($WO_3$), and molybdenum tris [1,2-bis(trifluoromethyl-)ethane-1,2-dithiolene] ($Mo(tfd)_3$).

Another group of materials suitable for use as a p-type contact layer includes inorganic compounds, such as, for example, NiOx, CuSCN, CuI, $Cu_2O$. These materials can be doped with impurities to alter their electrical and optical properties.

Unexpectedly, it was discovered that some materials, more conventionally used in combination with perovskite absorber materials, could be paired with CdTe-based absorbers and other type II-VI alloys to demonstrate a superior combination of optical and electrical properties relative to conventional back contact materials. It was further discovered that selected compositions, including poly-triarylamine (PTAA) and nickel oxide (NiOx), can be utilized for the p-type contact layer in processes that include doping the absorber layer with arsenic, antimony, or bismuth, and are well suited for use in manufacturing processes.

Referring to FIGS. 5-8, a set of devices were prepared and device performance was compared. Control devices were prepared with a structure of glass/TCO/CdTe/Au and glass/TCO/CdTe/ZnTe/Au. Experimental devices were prepared with the structure glass/TCO/CdTe/NiOx/Au, glass/TCO/CdTe/P3HT/Au, glass/TCO/CdTe/PTAA/Au, and glass/TCO/CdTe/SpiroOMeTAD/Au.

The NiOx, P3HT, PTAA, and SpiroOMeTAD layers were prepared by a spin-coating method. Layers of P3HT, PTAA, and SpiroOMeTAD with various thicknesses were deposited by spin coating at 3000, 4000, 5000, or 6000 revolution per minute (rpm). The NiOx layers were prepared by 1×, 2× or 3× repetition of a 1000 rpm spin-coating growth sequence. The experimental devices were prepared with a range of thicknesses for the p-type contact layer. After formation, the layers were heat treated at a temperature in a range of 100-150 C for a duration of 30-120 minutes. A gold (Au) back contact was applied. The devices were characterized in the as-deposited state and after a light-soak treatment.

Figure 5:
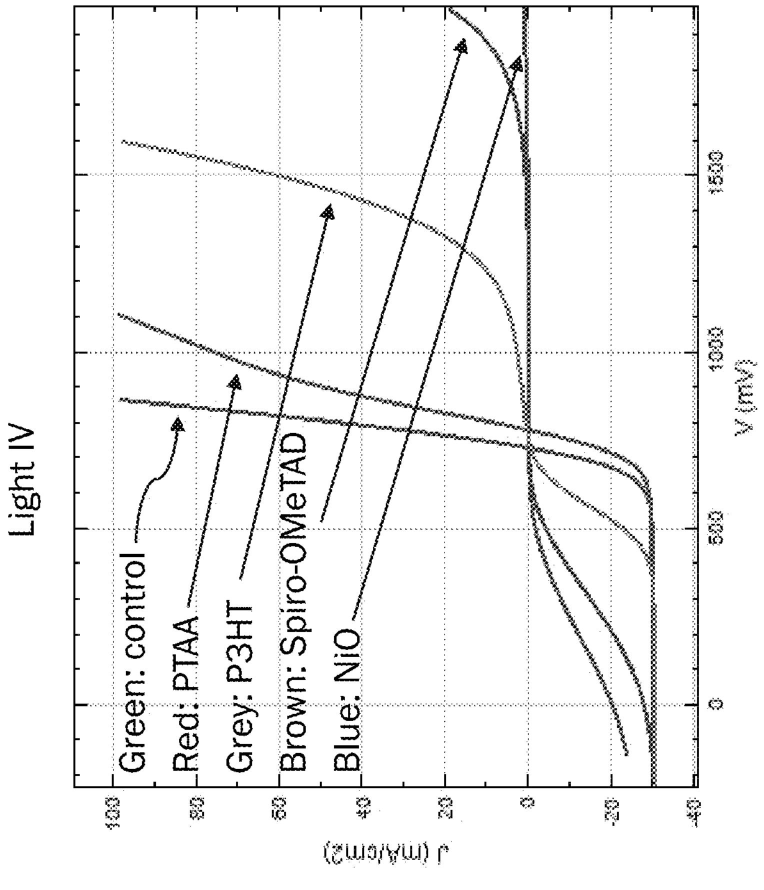
FIG. 5 shows a comparison of performance characteristics for current-voltage (IV) curves of comparative devices having p-type contact layers of NiOx, P3HT, PTAA, or SpiroOMeTAD according to embodiments shown and described herein.

FIG. 5 shows a comparison of performance characteristics for current-voltage (IV) curves of comparative devices having p-type contact layers of NiOx, P3HT, PTAA, or SpiroOMeTAD. The devices were tested with and without light soaking and the tested devices included devices with various thicknesses, as described above. PTAA demonstrated the best efficiency, with a 1.55% efficiency gain over control.

Figure 6:
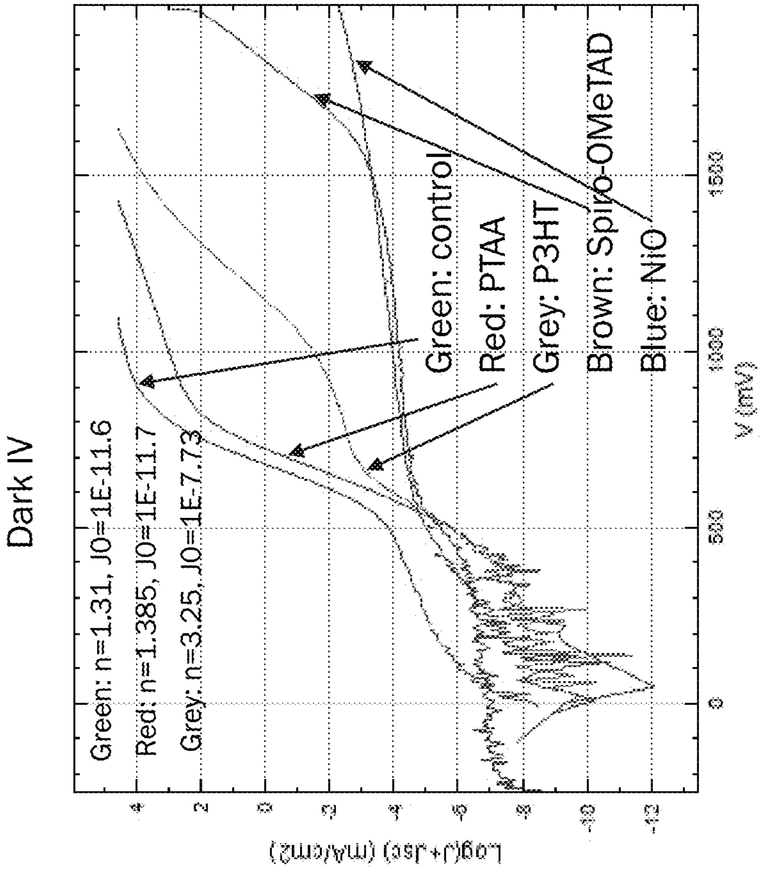
FIG. 6 shows a comparison of performance characteristics for current-voltage (IV) curves under dark conditions for devices according to embodiments shown and described herein.

FIG. 6 shows a comparison of performance characteristics for current-voltage (IV) curves under dark conditions for comparative devices as described above.

Figure 7:
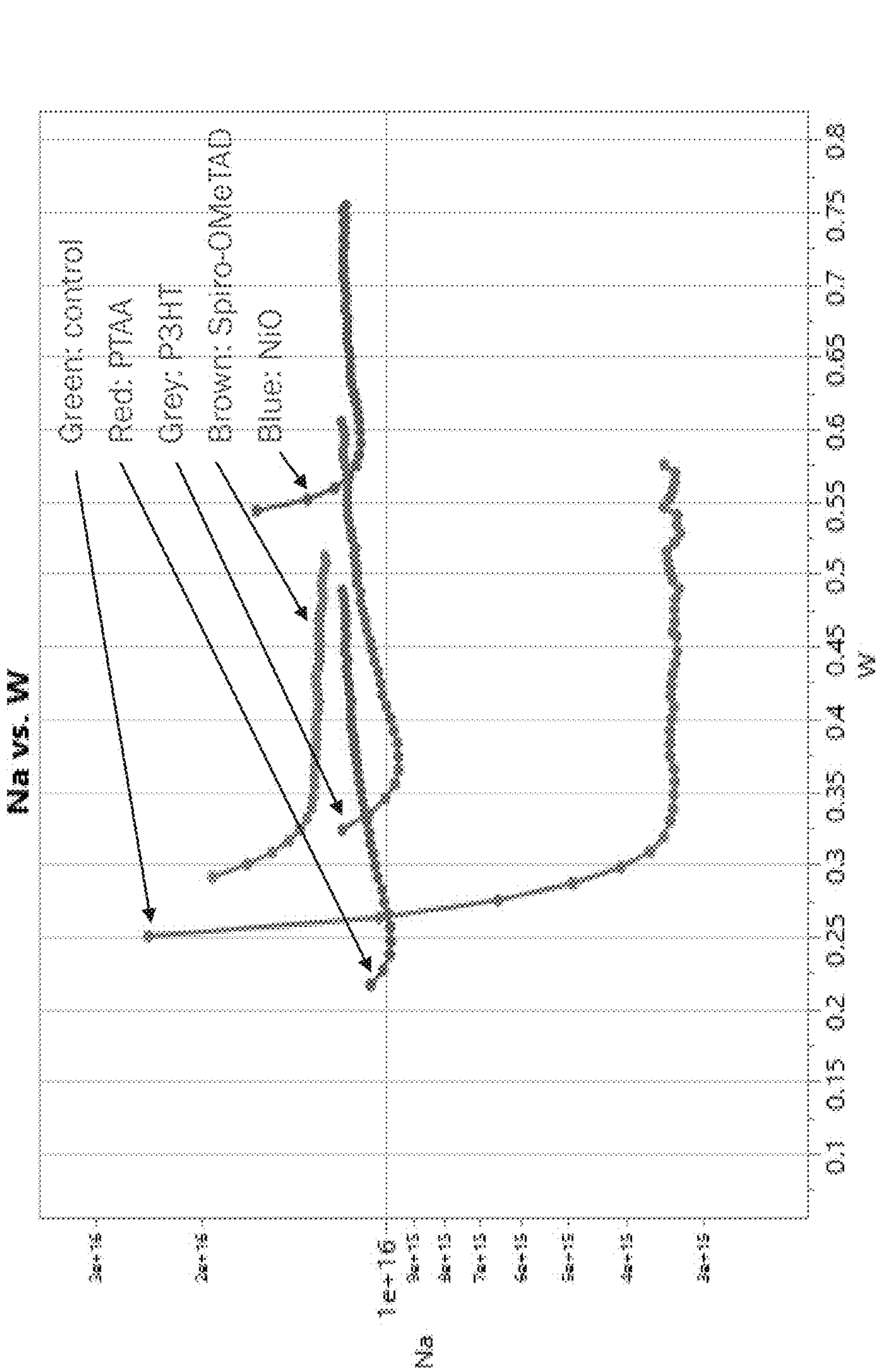
FIG. 7 shows a comparison of performance characteristics with the carrier concentration number of acceptors (Na) versus depletion width (W) in microns (μm) of control devices and devices according to embodiments shown and described herein.

FIG. 7 shows a comparison of performance characteristics for the carrier concentration number of acceptors (Na) versus depletion width (W) in microns (μm) for comparative devices as described above. PTAA and SpiroOMeTAD show slightly higher carrier concentration levels. Experimental data confirm that the p-type contact layer conductivity was good and produced no increase in parasitic capacitance at the back interface.

Figure 8:
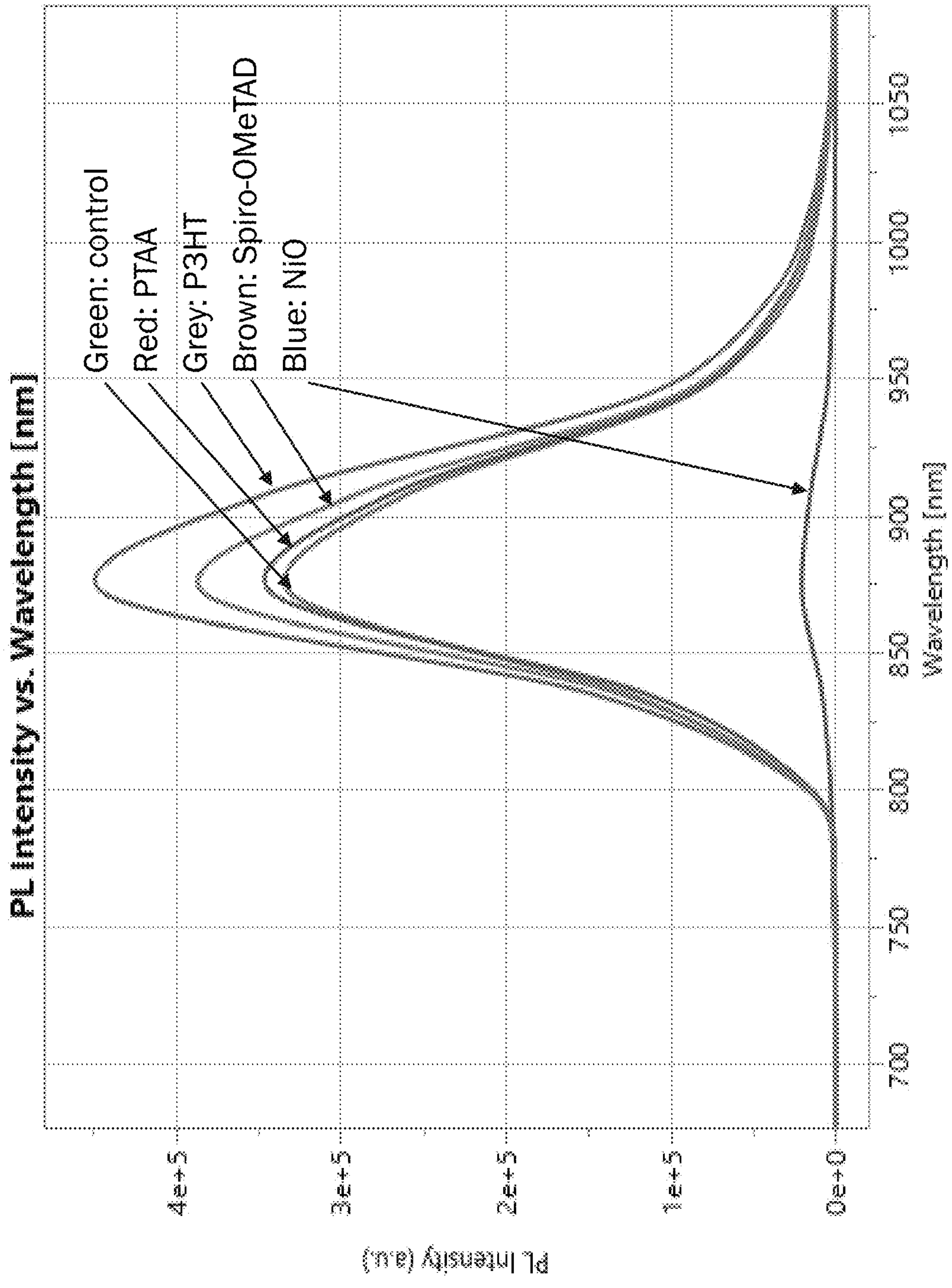
FIG. 8 shows a comparison of performance characteristics for photoluminescence intensity with respect to peak wavelength of control devices and devices according to embodiments shown and described herein.

FIG. 8 shows a comparison of performance characteristics for photoluminescence intensity for comparative devices as described above.

The comparative performance characteristics shown in FIGS. 5-8 and in the comparative testing results indicate that the tested structures were efficacious. Good efficiency, high ohmic contact, low shunting, and good carrier concentration levels were observed. The metrics show the tested structures performed similar or superior to controls in multiple parameters.

In an example method, a device is prepared. A TCO on glass may function as a front electrode. An absorber can be directly deposited on the TCO layer or may be deposited onto a buffer layer over the TCO layer. The absorber material may include sublayers of cadmium telluride selenide with cadmium telluride, cadmium zinc telluride, and/or zinc telluride. A surface treatment can be performed on the absorber surface. The treatment may include doping, passivating the surface with a cadmium chloride heat treatment, cleaning the surface with an acid or base and removing oxides. The p-type contact material may then be deposited over and in contact with the treated surface of the absorber layer.

The p-type contact material can be directly deposited to form the layer by various methods including, for example, sputtering, spin coating, evaporation. In an example, the p-type contact material comprises PTAA. In an example, the structure of the thin film junction stack formed is TCO/CdSeTe/CdTe:As/PTAA. The partly-formed device stack may then be subjected to a heat treatment, for example, heating at 80-150 C for a period of 30-120 minutes. The post deposition heat treatment of the p-type contact may be performed using a hot plate, an oven, and or a pressure-controlled heating chamber. A conductive material may then be applied over the p-type contact layer.

The conductive material may include one or more metal elements. The conductive material may include a metal alloy, a nitride, an oxide, and/or an oxynitride. The conductive material may have sublayers of differing compositions.

In an example, a device with a nickel oxide (NiOx) p-type contact layer is prepared. The device is formed with a NiOx layer adjacent to an arsenic-doped p-type absorber comprising a type II-VI alloy comprising cadmium, tellurium, and selenium.

Nickel oxide (NiOx) based layers have excellent chemical and thermal stabilities which facilitate manufacturing by maintaining critical properties despite high temperatures and chemical passivation steps which may be used in subsequent processing steps following its deposition. High temperatures or extended heating can have a detrimental effect on some layers or components of a device, however, NiOx is resistant to these same conditions. NiOx does not react with arsenic dopants. NiOx has excellent chemical stability, low optical absorption, and relative high mobility as compared to organic p-type charge carrier contact layers. It has a high conduction band edge and provides electron blocking. P-type conductivity in undoped NiOx is largely from nickel vacancies.

Use of NiOx can be particularly beneficial when the p-type contact layer is a part of the substrate stack because the formed layer can maintain its characteristic features despite subsequent processing steps which may include prolonged exposure to high temperatures. In some embodiments a substrate stack comprising NiOx is formed and subsequently exposed to temperatures in a range of 400-700 C for a period of 1-3 hours.

In some embodiments, it is beneficial to form a NiOx film with a thickness of only a few nanometers for use as an interfacial layer for the p-type contact layer. It is often difficult to deposit an ultra-thin NiOx layer with high film quality. Control or proper adjustment of the band structure is beneficial to have good energy alignment to the selected type II-VI absorbers. NiOx can be deposited by many different methods. For example, preparation of a NiOx layer may be accomplished by vapor transport deposition (VTD), magnetron sputtering, pulsed laser deposition, or by thermal decomposition of nickel salts such as its chloride, nitrate, or acetate. A NiOx layer may be doped during deposition.

In some embodiments, it is beneficial to form a p-type contact layer, such as a NiOx film, using low temperature methods to prevent damage to underlying layers of the layer stack or to preserve a chemically-passivated state of a surface of the absorber layer. While NiOx is tolerant to high processing temperatures, it can also be formed without using high-heat methods. In an example, a nickel oxide layer is formed using a sol gel prepared from precursors including nickel compounds, such as nickelbis(acetylacetonate) or nickel(acac)$_2$. The nickel compounds are dissolved in a solvent, such as 2-methoxyethanol (EGME) or methoxypropanol (PGME). A chelating base, such as triethanol amine (TEOA) is added to form a sol gel mixture. Optionally dopants are added to the sol gel mixture. The mixture is then sonicated to form the sol gel. The sol gel is coated onto the partly-formed device. In an example, a sol gel coating can be formed by dipping, roll coating, spray coating, blade coating, or spin coating. NiOx sol gel coatings may be cured by a heat treatment performed at a relatively low temperature or for a short duration to control heat exposure to the layer stack of the partly-formed photovoltaic device.

The NiOx film thickness can be varied in a range from about 2 to 100 nm by changing the concentration of the nickel oxide precursor. The nickel oxide precursor can be a nickel salt. In some embodiments, the NiOx precursor may be one or more of: nickel chloride ($NiCl_2$), nickel nitrate $Ni(NO_3)_2$, or nickel acetate $Ni(CH_3COO)_2$. In some embodiments, the chelating base is selected from: triethanolamine, diethanolamine, ethanolamine, or tris. In some embodiments, the dopant is selected from: $CuCl_2$, CuCl, CuI, CuSCN, LiCl, LiOAC, KCl, CsCl, CsI, $MgCl_2$, or $Mg(OAC)_2$. In some embodiments, the dopants may include one or more of: Li, Cs, Cu, Mg, Sr, or rare earths such as Er, Tb or Eu. In some embodiments, the NiOx precursor sol gel can be coated once or multiple times to produce the desired thickness. In some embodiments, the curing temperature can be between 80° C. to 400° C. for a duration in a range from 1 minute to 120 minutes. In some embodiments, the curing temperature is less than 350° C., less than 325° C., less than 250° C., or less than 200° C. In some embodiments, the curing temperature is in a range of 80° C. to 250° C. In some embodiments, the curing time is between 5 minutes and 60 minutes. In some embodiments, the curing time is between 1 minute and 30 minutes. In some embodiments, the curing time is less than 35 minutes, less than 25 minutes, or less than 15 minutes.

Surface treatment of a back surface of an absorber layer, prior to forming a p-type back contact, can be used for passivation. For CdTe-based absorber materials, including doped ternary and quaternary alloys comprising similar amounts of cadmium and tellurium, alkaline treatments can produce Cd-rich surfaces. A p-type contact layer may be formed over, and directly contacting, the Cd-rich back surface to form an absorber interface and beneficially provide reduced surface recombination velocity at the absorber interface. However this benefit may be negated by high-temperature formation of a p-type back contact layer, such as by depositing a nitrogen-doped zinc telluride layer by vapor transport deposition over the passivated surface of the absorber layer.

High sustained temperatures may reduce the benefit of the passivation step or may damage layers of the partially-formed device layer stack. To maintain absorber passivation and layer stack integrity, processing steps following the passivation of the absorber surface are selected to not expose the intermediate structure, with the absorber layer over the substrate stack, to high temperatures or other conditions that could cause damage. Many p-type contact materials, including most organic polymer hole-transport materials, are susceptible to damage from heat, moisture, etchants, and some solvents. Because of these limitations, many processes which are used with other photovoltaic devices, or for earlier-deposited layers, may not be suitable for processing steps following an absorber layer Cd-enrichment step.

In some embodiments, a step of depositing a layer, using low temperature methods, is performed by at least one of: thermal evaporation, spray pyrolysis, closed space sublimation (CSS), chemical vapor deposition (CVD), atomic layer deposition (ALD), spin coating, spray coating, slot-die coating, blade coating, roll coating, dip coating, inkjet printing or sol-gel coating. In some embodiments, the step of depositing a layer, using a low temperature method prevents excessive heating of the substrate layer stack during deposition processes and is performed at substrate temperatures at or below 150° C., at or below 120° C., or at or below 100° C.

Passivation of an absorber surface may be performed by an alkaline chemical surface wash, which may further provide surface cleaning, surface organic contamination removal, and oxide removal. The term "wash" or "washing" includes subjecting, exposing, or contacting a wash fluid to a surface, such as the back surface of the absorber layer. By way of non-limiting example, the surface may be at least partially submerged in a bath by dipping it into the wash fluid, or the wash fluid can be applied to the substrate by spraying, coating, painting, flowing, or otherwise allowing the bath to contact at least a portion of the surface. Also, the surfaces of partially-formed devices can be subjected to surface cleaning or passivation in a continuous process, such as by conveyer continuously carrying the substrates into and out of a wash, or in a batch process.

A Te-rich surface, having unpassivated excess Te, detectable in the Raman signature of Te—Te bonding, shows greater recombination and reduced film-side photoluminescence. In order to reduce surface Te dangling bonds and adjust surface stoichiometry to a desired ratio, an alkaline etch or passivation with a wash fluid is performed. In an example, a method for modulating the surface stoichiometry of a semiconductor material, includes adjusting the concentration of the wash fluid to achieve a desired stoichiometric ratio on the surface of the semiconductor material and subjecting the semiconductor material to a passivation wash with the wash fluid. The pH of the wash fluid can be adjusted to modify the surface ratio of Cd to Te in a CdTe substrate. Using an alkaline wash with a pH level between about 8 and 14, a substantially stoichiometric CdTe surface can be modified to have a Cd-rich surface. In some embodiments a pH level of the wash fluid is between 11 and 13. The wash passivation method can be used to optimize back-contact surface chemical and electronic properties.

In some embodiments, the wash fluid comprises a hydroxide. In some embodiments, the wash fluid comprises an aqueous solution of sodium hydroxide (NaOH), potassium hydroxide (KOH), or tetramethylammonium hydroxide ($(CH_3)_4N(OH)$) also referred to as TMAH. In some embodiments, the wash fluid comprises KOH. In some embodiments, the wash fluid comprises KOH at a concentration ranging from about 0.001 M to about 11.67 M, in a range from 0.500 M to 4.000 M, in a range from 1.500 M to 2.750 M, or in a range from 1.750 M to 2.000 M. In some embodiments, the wash fluid comprised KOH at 1.946 M. In some embodiments, the wash fluid is contacted to the surface for a contact time in a range of 10 seconds to 90 minutes. In some embodiments, the contact time is in a range of 30 seconds to 30 minutes, or in a range of 30 seconds to 10 minutes. In some embodiments, the contact time is 1 minute. In some embodiments, the wash fluid temperature is in a range of 0° C. to 90° C. In some embodiments, the wash fluid temperature is in a range of 20° C. to 30° C. In some embodiments, the wash fluid temperature is in a range of 5° C. to 50° C. or in a range of 15° C. to 35° C. In some embodiments, the absorber surface is rinsed with water after contacting with KOH.

In some embodiments, a ratio of Cd to Te at the Cd-rich surface of the absorber layer is in a range from 1:1 to 4:1. In some embodiments, a ratio of Cd to Te at the Cd-rich surface of the absorber layer is greater than 1:1. In some embodiments, a ratio of Cd to Te at the Cd-rich surface of the absorber layer as measured by XPS is between 1.3:1 to 2.5:1.

In an example method, following a passivation step, a p-type back contact comprising a hole-transport material (HTM) is formed over the Cd-rich surface of the absorber layer. In some embodiments, the absorber layer comprises a plurality of sublayers with a sublayer contiguous with the back surface consisting essentially of cadmium telluride, doped cadmium telluride, or a ternary or quaternary alloy including cadmium and tellurium. In an example, the absorber layer comprises a plurality of sublayers and the sublayer contiguous with the back surface consists essentially of arsenic-doped cadmium telluride.

Hole transport materials (HTMs) have high hole mobility and a low electron affinity. Thus, when minority carriers (electrons) reach the back contact interface, the HTM blocks their transport through the p-type contact and minimizes interfacial recombination, while allowing facile transport of majority carriers (holes). The p-type contact layer is deposited at low temperature to preserve the chemically passivated state of the absorber surface. The p-type contact layer is deposited on a cadmium-rich or stoichiometric CdTe-containing surface in which the cadmium-rich or stoichiometric surface is created by treating as-grown CdTe polycrystalline films with one or more basic solutions, such as potassium hydroxide or tetramethylammonium hydroxide. Without wishing to be bound by theory, the p-type layer interacts with the CdTe surface weakly via Van der Waals interaction or hydrogen bonding. The p-type layer has a large conduction band offset with CdTe to block electrons from recombining at the metal contact and a small valence band offset to allow efficient hole transport. As the diffusion length of photogenerated minority carriers becomes comparable to the thickness of the absorber films, the value of the back contact surface recombination velocity can contribute significantly to the overall device recombination current. Additionally, for bifacial solar cell design, reduction in back contact surface recombination has a strong impact on the open circuit voltage and the potential for efficiency gains from back-side illumination. Reductions in back contact recombination rates can allow for photovoltaic devices with improved minority carrier lifetimes and higher open circuit voltages (Voc).

Selected HTMs allow hole conduction much more favorably than electron transport, improving the hole selectivity of the back contact. As these p-type contact layers can be deposited or formed at relatively low temperatures (such as ≤100° C.), back contact variations can be performed with relatively minimal impact on the front junction, absorber passivation, and bulk properties of the absorber material. Photovoltaic devices using a p-type contact layer as described show an increase in photoluminescence intensity and open circuit voltage, indicating an improvement in hole selectivity.

Figure 9A:
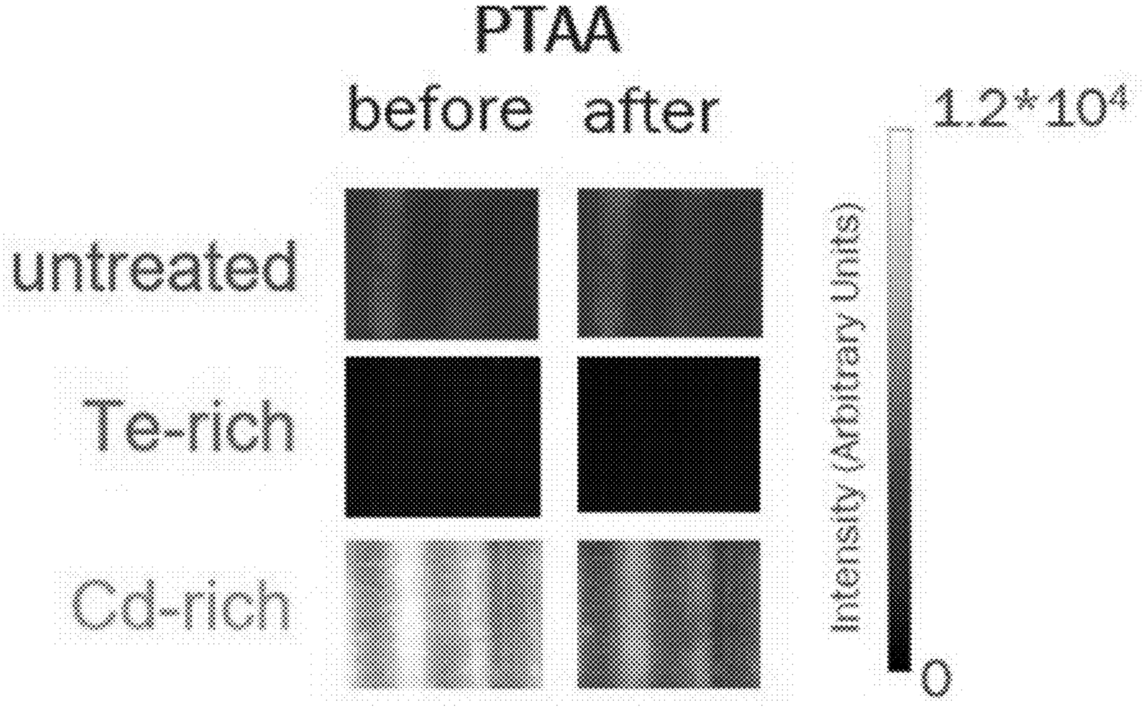
FIGS. 9A-9B show a comparison of performance characteristics for photoluminescence intensity with respect to peak wavelength of control devices and devices according to embodiments shown and described herein.
Figure 9B:
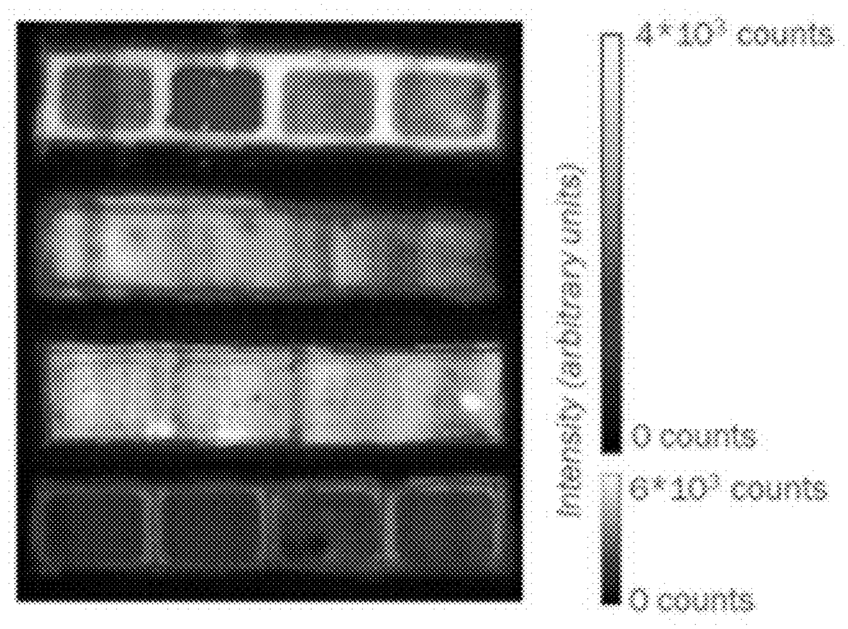
Figure 10:
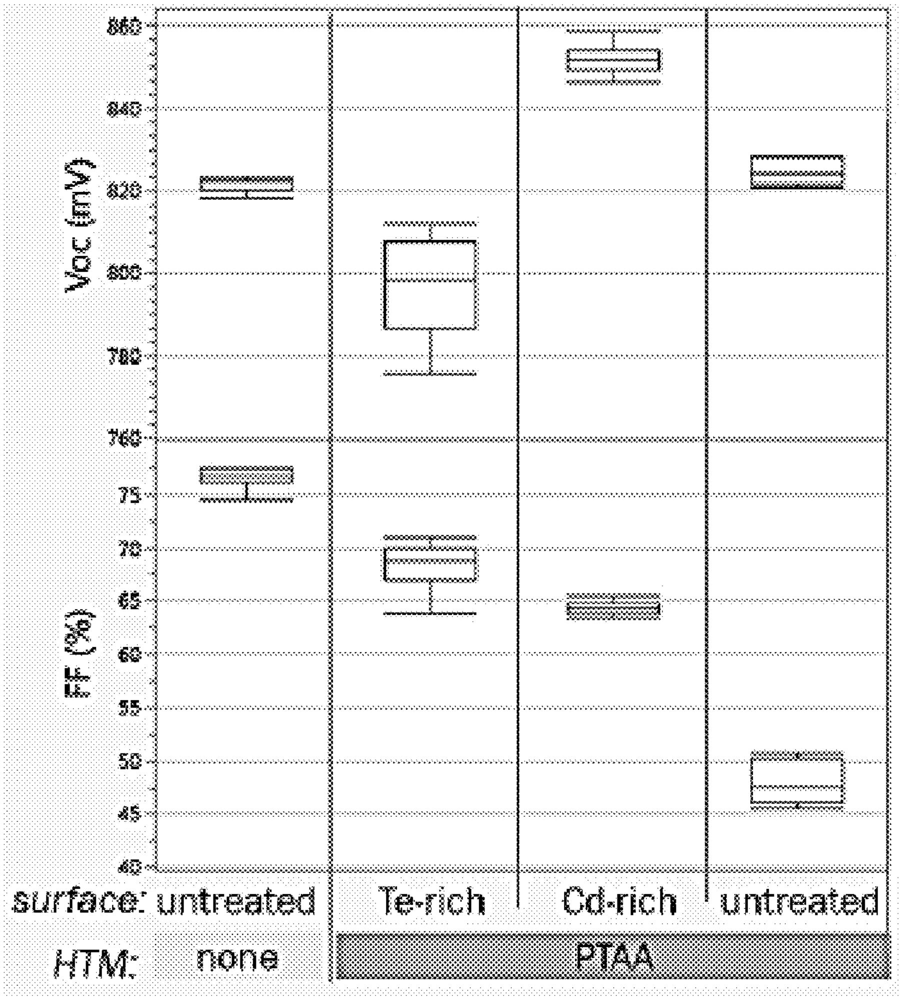
FIG. 10 shows a comparison of performance characteristics for Voc and FF for control devices and devices according to embodiments shown and described herein.

With reference to FIGS. 9-10, a set of devices were prepared and performance was compared. Solar cell device stacks with high quality bulk material were prepared using arsenic-doped CdSeTe and CdTe alloyed films as an absorber layer and subjected to a $CdCl_2$ treatment. Differing back surface treatments were performed and compared to evaluate treatments that produce an absorber layer surface that is either Te-rich or Cd-rich.

After surface treatment, deposition of HTMs was performed. The high hole mobility material, Poly[bis(4-phenyl)(2,4,6-trimethylphenyl)amine (PTAA), was used as a conductive hole transport layer. PTAA was un-doped or doped with F4-TCNQ. PTAA solid material was dissolved in chlorobenzene solvent. This layer was spin-coated on the CdTe films and followed by a hotplate bake. Solar cells were completed with a thermal deposition of a metal layer and solder lines for contacting a front contact comprising a transparent conductive oxide layer.

The photoluminescence intensity of surface-treated absorber layer films was measured on both the front glass side and back film side under illumination with a 660 nm laser at an intensity corresponding to 100 sun illumination. This data was complimented with photoluminescence imaging performed on an LIS-P2 luminescence tool. Raman microscopy was also performed on treated surfaces. Current-voltage (IV) device performance was measured on completed solar cells.

FIG. 9A shows back-side photoluminescence (PL) imaging for different surface treatments. From top to bottom the samples are: untreated, Te-rich, and Cd-rich. The left column shows devices measured immediately after surface treatment and before PTAA coating. The right column shows measurements after PTAA coating and before applying a metal layer.

Spin-coating PTAA had no significant effect on the PL measured for the sample without surface treatment, indicating that PTAA does not have significant passivating effects on its own. Deposition of the PTAA showed a partial decrease in the photoluminescence of the Cd-rich surfaces, but still maintained elevated PL.

Photoluminescence intensity measurements can be sensitive to spatial non-uniformities of the CdTe films, particularly at high PL intensities. As illustrated in FIG. 9A, photoluminescence imaging allows a helpful method to verify these results, indicating a large PL decrease for surfaces treated to be Te-rich, and a large PL increase for surfaces treated to be Cd-rich. Films with Cd-rich surfaces confirm a partial decrease in PL intensity after PTAA deposition, and indicate unchanged or slightly decreased PL for the Te-rich surface. The untreated surface shows very little shift in PL after PTAA deposition.

FIG. 9B shows a comparison of front side photoluminescence imaging for treated or untreated absorber surface and devices with or without a PTAA layer. The top two samples show results for the untreated absorber layer, while the bottom two samples show results for an absorber with a back surface treated with a potassium hydroxide (KOH) wash. Note the different scale bars for the last sample. The top and bottom samples show results for a device with a metal layer over the absorber with no HTM layer. The middle two samples show results for devices with a PTAA layer between a metal layer and the absorber layer. Dark squares represent high recombination at the metal contacts.

Photoluminescence images taken from the front side indicate increased non-radiative recombination in regions with untreated metal contacts. Samples with PTAA demonstrate an ability to reduce this recombination pathway, with high PL maintained in the areas under the metal contacts. PTAA shows effectiveness at blocking electron recombination at the back metal contact regardless of surface treatment. Furthermore, surfaces treated to be Cd-rich without the PTAA HTM lose much of their passivation after metal contact deposition, indicating the HTM aids in maintaining high passivation levels in completed devices.

Photoluminescence intensity data illustrated a strong contrast between the untreated and Cd-rich surfaces. Te-rich surfaces, while used in the past for producing ohmic contacts, are believed to lead to increased non-radiative recombination. This is indicated by a stark decrease in PL intensity in FIG. 9A for the Te-rich surfaces. Likewise Cd-rich surfaces showed a dramatic increase in PL intensity. Back side PL measurements are the more direct measurement of the passivation quality of the back surface. Front side PL is more indicative of the overall minority carrier lifetime within the device, and so is less sensitive to back surface treatments and more sensitive to bulk quality. The observed increase in front side PL after Cd-rich back surface treatment indicates this treatment significantly decreases the non-radiative recombination of photogenerated carriers diffusing from the front side, indicating an influence on solar cell Voc.

FIG. 10 provides solar cell device results showing Voc and FF for samples with PTAA hole transport layers. Cd-rich surfaces, which had shown a beneficial result on photoluminescence, yielded the highest device Voc values. The samples with Te-rich surfaces showed a decreased average Voc, correlating with the decreased photoluminescence of these Te-rich surfaces. PTAA without surface treatment had no clear impact on Voc. No significant change in Jsc was observed between samples, as confirmed by QE measurements. Devices using the combination of both Cd-rich surfaces and the PTAA hole transport material, reached Voc values up to 858 mV.

CdTe solar cells with improved back contact passivation were demonstrated using a PTAA hole transport material deposited on surfaces treated to be Cd-rich. High device Voc relies on the combination of these two components. Surface treatment producing Cd-rich surfaces enables passivation of CdTe surfaces for increased PL, but this passivation is not maintained after metal contact deposition. This is explained by the inherent high surface recombination velocity of metal-semiconductor contacts. Introduction of an additional PTAA layer provides a barrier to electrons reaching the rear metal contact. However PTAA by itself does not provide a major passivating effect. Measured photoluminescent behaviors match well with the final device Voc results.

In another example, devices with PTAA deposited over a Cd-rich absorber surface were compared with the performance of devices having a nitrogen-doped zinc-telluride (ZnTe:N) p-type back contact. The absorber surface of the device with PTAA was treated with an aqueous alkaline wash having a concentration in a range of of 0.01M to 4M KOH for 10 to 180 seconds, PTAA was deposited by thermal evaporation and a metal contact applied. The absorber surface of the comparison device was treated with an acid wash of hydrochloric acid (HCl), a layer of ZnTe:N was deposited by sputtering, and a metal contact applied. Devices with a PTAA p-type back contact showed an average 15-20 mV Voc gain relative to comparison devices with a ZnTe:N p-type back contact.

In another example, devices were prepared with differing p-type contact layers to compare performance. Devices were prepared with p-type contact layers formed from selected HTMs, including: PTAA, PIF8-TAA, poly-TPD, TFB, and PF8-TAA. The selected HTMs were deposited over an absorber layer. The absorber layer was formed from sublayers comprising CdSe and CdTe. A surface doping treatment was performed with an As dopant and the partially-formed devices were heat-treated with $CdCl_2$. The devices were prepared with the selected HTMs and evaluated, showing good performance characteristics.

In an example, a p-type contact layer comprises at least one HTM selected from: semiconducting polymers, polytriarylamine, PTAA, poly-TPD, TFB, PF8-TAA, PIF8-TAA, P3HT, PDI, CPB, TCTA, TCP, PCDTBT, anthracene-based HTM, Spiro-OMeTAD, NiOx, CuSCN, or CuI, or combinations thereof.

In an example, the structure of the thin film junction stack is TCO/CdSeTe/CdTe/PTAA. In an example, the structure of the thin film junction stack is TCO/CdSeTe/CdTe:As/PTAA. In an example, the structure of the thin film junction stack is TCO/CdSeTe/CdTe:As/CdZnTe/PTAA. In an example, the structure of the thin film junction stack is TCO/CdSeTe/CdTe:As/PTAA/ZnTe. In an example, the structure of the thin film junction stack is TCO/CdSeTe/CdTe:As/CdZnTe/PTAA/NiOx. In an example, the structure of the thin film junction stack is TCO/CdZnTe/PTAA.

The thin film junction stack of the described device structure may be adapted for use with a tandem photovoltaic device or for use with a bifacial module.

According to the embodiments provided herein, the p-type contact layer can include one or more functional layers of material.

In some embodiments, a conductive layer is disposed over the thin film junction stack and adjacent to the p-type contact layer. In some embodiments the conductive layer comprises a metal selected from silver, nickel, copper, aluminum, titanium, palladium, chrome, molybdenum, or gold. In some embodiments the conductive layer comprises a nitrogen-containing metal layer, such as, aluminum nitride, nickel nitride, titanium nitride, tungsten nitride, selenium nitride, tantalum nitride, or vanadium nitride.

In some embodiments, the p-type contact layer can have an average transmittance greater than 70% to light having a wavelength between 400 nm and 700 nm. Optionally, the p-type contact layer 180 can have an average transmittance greater than about 50% to light having a wavelength 400 nm to 1000 nm such as, for example, greater than about 85% in one embodiment, or greater than about 90% in another embodiment, or greater than about 95% in further embodiment.

A thickness of the p-type contact layer can be less than about 500 nm such as, for example, between about 0.5 nm and about 100 nm in one embodiment, or between about 5 nm and about 50 nm in another embodiment.

Suitable materials for the p-type contact layer 180 can include materials such as, for example, PTAA, P3HT, PEDOT:PSS, Spiro-OMeTAD, SAF-OMe, SGT-407, Fused-F, OMeTPA-FA, alpha-NPD, TIPS-pentacene, PCPDTBT, PCDTBT, quinolizino acridine, TTF-1, NiOx, graphene oxide, CuSCN, CuI, or $Cu_2O$. These can be doped with impurities to alter their electrical and optical properties.

Unexpectedly, it was discovered that PTAA and NiOx demonstrated a superior combination of optical and electrical properties for use with semiconductor absorbers comprising cadmium and tellurium. Further, PTAA or NiOx layers formed adjacent to type II-VI semiconductors doped with a Group V dopant such as, for example arsenic, antimony, or bismuth, provide superior performance properties. Additionally, PTAA and NiOx are compatible with higher temperature manufacturing processes relative to many other materials.

It should now be understood that the functional layers of the p-type contact layer can provide ohmic contact with improved passivation to the absorber, while providing comparable functionality and reliability relative to known p-type contact layers for type II-VI absorber materials. Accordingly, the embodiments provided herein can improve the utility of photovoltaic devices.

According to embodiments described herein, a photovoltaic device can include an absorber layer on a substrate stack, the absorber layer comprising a type II-VI semiconductor; a p-type contact layer on the absorber layer, the p-type contact layer comprising at least one of PTAA, P3HT, TTF-1, SGT-407, SpiroOMeTAD, NiO, CuSCN, or CuI; and a conductive layer on the p-type contact layer.

In some embodiments, the absorber layer comprises cadmium telluride selenide; the absorber layer is doped with at least one dopant selected from arsenic, antimony, or bismuth; and the p-type contact layer comprises PTAA, P3HT, TTF-1, SGT-407, SpiroOMeTAD, or NiO.

In some embodiments, the absorber layer comprises copper-doped cadmium telluride selenide.

According to embodiments described herein, a p-type contact layer for a photovoltaic device is provided. In some embodiments the p-type contact layer is provided with a substantially uniform thickness over the entirety of a directly adjacent passivated absorber layer surface. In some embodiments the p-type contact layer is provided with substantially continuous coverage of 90% to 100% in a substantially uniform thickness over the directly adjacent absorber layer surface. In some embodiments the p-type contact layer is provided with noncontinuous coverage over a portion of an absorber layer surface. In some embodiments the p-type contact layer is provided with discontinuous coverage over 10% to 25% of an absorber surface. In some embodiments the p-type contact layer is provided for selective area contacts. In some embodiments the photovoltaic device comprises an absorber layer having a type II-VI semiconductor. In some embodiments, the p-type contact layer comprises a PTAA layer in contact with the absorber layer, wherein the PTAA layer has a continuous or noncontinuous coverage with thickness of 0.5 nm to 500 nm. In some embodiments the thickness of the p-type contact layer is in a range between 0.5 nm and 100 nm, between 5 nm and 200 nm, between 5 nm and 50 nm, between 10 nm to 100 nm, or between 10 nm and 50 nm.

In some embodiments, the p-type contact layer comprises a PTAA layer in contact with the absorber layer having a type II-VI semiconductor, wherein the PTAA layer has a thickness of 10-100 nm, the type II-VI semiconductor comprises cadmium, tellurium, selenium, and zinc, and the type II-VI semiconductor is doped with arsenic.

According to embodiments described herein, a method of making a photovoltaic device is provided and includes: depositing a type II-VI semiconductor over a substrate stack to form an absorber layer; depositing a p-type contact layer over the absorber layer, wherein the p-type contact layer comprises at least one of PTAA, P3HT, TTF-1, SGT-407, Spire SpiroOMeTAD, NiO, CuSCN, or CuI; and depositing a conductive layer over the p-type contact layer.

In some embodiments, the method includes heating the p-type contact layer at a temperature in a range of 80-150 C for a period of at least two minutes, 10-120 minutes, 30-120 minutes, or 5-60 minutes, prior to the step of depositing a conductive layer. In some embodiments, the heat treatment of the p-type contact may be performed using a hot plate, an oven, and or a pressure-controlled heating chamber.

In some embodiments, the p-type contact layer comprises NiOx deposited by sputtering.

In some embodiments, forming the absorber layer further comprises doping, passivating; and removing oxides from the type II-VI semiconductor prior to depositing the p-type contact layer.

In some embodiments, the p-type contact layer is a polymer, a small molecule, or an inorganic compound.

In some embodiments, the p-type contact layer comprises a polymer selected from PTAA, P3HT, or PEDOT:PSS. In some embodiments, the p-type contact layer is PTAA.

In some embodiments, the p-type contact layer comprises a small molecule selected from Spiro-OMeTAD, SAF-OMe, OMeTPA-FA, or TTF-1.

In some embodiments, the p-type contact layer comprises an inorganic compound selected from NiOx, CuSCN, CuI, $Cu_2O$. In some embodiments, the p-type contact layer is NiOx.

It is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A method of making a photovoltaic device comprising:
forming an absorber layer over a substrate stack, wherein the absorber layer comprises a type II-VI semiconductor material, wherein the type II material includes cadmium (Cd) and the type VI material includes tellurium (Te);
contacting an alkaline wash fluid, comprising a hydroxide, to a second surface of the absorber layer to produce a Cd-rich surface, wherein the Cd-rich surface comprises cadmium and tellurium, and the Cd-rich surface has a ratio of Cd to Te greater than 1:1 and equal to or less than 4:1;
depositing a p-type contact layer over the absorber layer, whereby the p-type contact layer is directly adjacent to the Cd-rich surface, and
wherein the p-type contact layer comprises at least one of: PTAA, P3HT, poly-TPD, TFB, TTF-1, PF8-TAA, PIF8-TAA, SGT-407, PCDTBT, SpiroOMeTAD, anthracene-based HTM, polythiophene, or semiconducting polymers; and the p-type contact layer has discontinuous coverage over the second surface of the absorber layer; and
depositing a conductive layer over the p-type contact layer.

2. The method of claim 1, wherein the step of depositing the p-type contact layer is performed at a substrate temperature at or below 150 °C.

3. The method of claim 1, wherein the hydroxide comprises at least one of:
sodium hydroxide (NaOH), potassium hydroxide (KOH), or tetramethylammonium hydroxide ($(CH_3)_4N(OH)$) TMAH.

4. The method of claim 1, wherein the p-type contact layer comprises PIF8-TAA, poly-TPD, or PTAA undoped or doped with F4-TCNQ.

5. The method of claim 1, wherein the absorber layer is doped with at least one dopant selected from phosphorus, arsenic, antimony, or bismuth.

6. The method of claim 1, wherein the Cd-rich surface has a ratio of Cd to Te greater than 1.3:1 and equal to or less than 2.5:1.

7. The method of claim 1, wherein the p-type contact layer is deposited by slot-die coating, blade coating, roll coating, spray coating, spin coating, evaporation, or sol-gel formation.

8. A photovoltaic device comprising:
an absorber layer on a substrate stack, the absorber layer comprising a type II-VI semiconductor, wherein the type II material includes cadmium (Cd) and the type VI material includes tellurium (Te);
a p-type contact layer on the absorber layer, the p-type contact layer comprising at least one of PTAA, P3HT, poly-TPD, TFB, TTF-1, PF8-TAA, PIF8-TAA, SGT-407, PCDTBT, SpiroOMeTAD, anthracene-based HTM, polythiophene, semiconducting polymers, NiO, CuSCN, or CuI; and
a conductive layer on the p-type contact layer;
wherein the p-type contact layer is directly adjacent to a second surface of the absorber layer at a passivated interface, and the second surface of the absorber layer is a Cd-rich surface, wherein a ratio of Cd to Te is greater than 1:1, and the p-type contact layer has discontinuous coverage over 10% to 25% of the second surface of the absorber layer.

9. The photovoltaic device of claim 8, wherein the absorber layer is doped with at least one dopant selected from phosphorus, arsenic, antimony, or bismuth; and wherein the p-type contact layer comprises PIF8-TAA, PF8-TAA, poly-TPD, TFB, or PTAA.

10. The photovoltaic device of claim 8, wherein:
the absorber layer comprises cadmium telluride selenide;
the absorber layer is doped with at least one dopant selected from arsenic, antimony, or bismuth; and
the p-type contact layer comprises PTAA, P3HT, TTF-1, SGT-407, SpiroOMeTAD, or NiOx.

11. The photovoltaic device of claim 8, wherein:
the conductive layer is adjacent to the p-type contact layer, and
the conductive layer comprises at least one metal or metal nitride.

12. The method of claim 1, wherein the p-type contact layer is heated at a temperature in a range of 80-150 °C prior to the step of depositing a conductive layer.

13. The method of claim 12, wherein heat treatment of the p-type contact layer is performed using a hot plate, an oven, and or a pressure-controlled heating chamber.

14. The method of claim 1, wherein the absorber layer comprises cadmium telluride selenide, and the p-type contact layer covers 10% to 25% of the second surface of the absorber layer.

15. The method of claim 1, wherein the p-type contact layer has a thickness less than 50 nm.

16. The method of claim 1, wherein the conductive layer is adjacent to the p-type contact layer, and the conductive layer comprises at least one metal nitride.

17. The method of claim 1, wherein the p-type contact layer comprises at least one of: PTAA, P3HT, or SpiroOMeTAD.

18. A method of making a photovoltaic device comprising:
providing an absorber layer on a substrate stack, wherein:
the absorber layer comprises a polycrystalline film; and
the absorber layer has a second surface comprising a p-type alloy of cadmium (Cd) and tellurium (Te);
contacting an alkaline wash fluid, comprising a hydroxide, to the second surface of the absorber layer to produce a Cd-rich surface, wherein the Cd-rich surface has a ratio of Cd to Te greater than 1.3:1 and equal to or less than 2.5:1;
forming an ohmic contact by depositing a p-type contact layer over the absorber layer; wherein:
the step of depositing the p-type contact layer is performed after the contacting step;
the p-type contact layer is directly adjacent to the Cd-rich surface;
the p-type contact layer comprises a polymer or small molecule hole-transport material, whereby an ohmic contact is formed between the second surface of the absorber layer and the p-type contact layer; and
the p-type contact layer has discontinuous coverage of the second surface of the absorber layer; and
depositing a conductive layer over the p-type contact layer;
wherein the conductive layer comprises at least one metal or metal nitride;
wherein the steps of: forming an ohmic contact and depositing a conductive layer, are performed at substrate temperatures below 150 °C.

19. The method of claim 18, wherein:

the contacting step comprises contacting the alkaline wash fluid to the p-type alloy of cadmium and tellurium for a contact time in a range of 10 seconds to 30 minutes; wherein:

the p-type alloy of cadmium and tellurium is doped with arsenic (As); and the alkaline wash fluid comprises potassium hydroxide at a concentration in a range from 0.500 M to 4.000 M; and the p-type contact layer comprises at least one of: PTAA or P3HT.

20. The method of claim 18, wherein the p-type contact layer covers 10% to 25% of the second surface of the absorber layer.

* * * * *